United States Patent
Inoue

(10) Patent No.: US 7,880,535 B2
(45) Date of Patent: Feb. 1, 2011

(54) SEMICONDUCTOR DEVICE, CONTROL METHOD OF SEMICONDUCTOR DEVICE, AND CONTROL INFORMATION GENERATING METHOD FOR SEMICONDUCTOR DEVICE

(75) Inventor: Yoshio Inoue, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 206 days.

(21) Appl. No.: 12/188,449

(22) Filed: Aug. 8, 2008

(65) Prior Publication Data
US 2009/0085653 A1 Apr. 2, 2009

(30) Foreign Application Priority Data
Sep. 28, 2007 (JP) ............................. 2007-253575

(51) Int. Cl.
*G05F 1/10* (2006.01)
(52) U.S. Cl. ........................................ 327/544; 327/538
(58) Field of Classification Search .................. 327/544
See application file for complete search history.

(56) References Cited
U.S. PATENT DOCUMENTS
2007/0106966 A1* 5/2007 Inoue et al. ..................... 716/4

2008/0191681 A1* 8/2008 Okano et al. ................. 323/349

FOREIGN PATENT DOCUMENTS
JP 2007-133497 5/2007

OTHER PUBLICATIONS

Hiroshi Okano, et al., "Supply Voltage Adjustment Technique for Low Power Consumption and its Application to SOCs with Multiple Threshold Voltage CMOS", 2006 Symposium on VLSI Circuits Digest of Technical Papers.

* cited by examiner

*Primary Examiner*—Lincoln Donovan
*Assistant Examiner*—Ryan C Jager
(74) *Attorney, Agent, or Firm*—Fujitsu Patent Center

(57) ABSTRACT

A semiconductor device 2 has a plurality of elements. It also has an F-V table storing unit for low voltage threshold cells 31 for storing an F-V table TB11 of an oscillation frequency f1 relying on the plurality of elements and a power supply voltage EV to be supplied to the plurality of elements. It has a process sensor block 12 having at least one of the plurality of elements, for monitoring the oscillation frequency f1 relying on at least one element. It further has a selector 33 for setting the power supply voltage EV associated with the oscillation frequency f1, as the supply voltage to be supplied to the semiconductor device 2 by selecting according to the F-V table TB11. The F-V table TB11 is obtained by mutually relating the combinations of random number models $\xi n$ between an F-$\xi$ table TB20 and an $\xi$-V table TB30.

13 Claims, 11 Drawing Sheets

SCHEMATIC DIAGRAM OF SEMICONDUCTOR DEVICE SYSTEM 1

FIG. 1 SCHEMATIC DIAGRAM OF SEMICONDUCTOR DEVICE SYSTEM 1

FIG. 2  CIRCUIT DIAGRAM OF
RING OSCILLATOR 21 FOR LOW VOLTAGE THRESHOLD CELLS

FLOWCHART OF RING OSCILLATOR CIRCUIT'S FREQUENCY CHARACTERISTIC ANALYSIS METHOD

FIG. 5  DIAGRAM SHOWING F-$\xi$ TABLE TB20

| RANDOM NUMBER MODEL $\xi n$ / OSCILLATION FREQUENCY f1 | $\xi_1$ | $\xi_2$ | $\xi_3$ |
|---|---|---|---|
| 100 (MHz) | +1 | -2 | -3 |
|  | -3 | +3 | -2 |
|  | 0 | -1 | -1 |
| 200 (MHz) | 0 | -3 | 0 |
|  | -1 | +2 | +1 |
|  | +2 | 0 | -1 |
| ⋮ | ⋮ | ⋮ | ⋮ |

TB20

FLOWCHART OF IN-CHIP CIRCUIT CHARACTERISTIC'S TIMING ANALYSIS METHOD

FIG. 7   CIRCUIT DIAGRAM OF CRITIC PATH
FIG. 8   DIAGRAM SHOWING ξ-V TABLE TB30
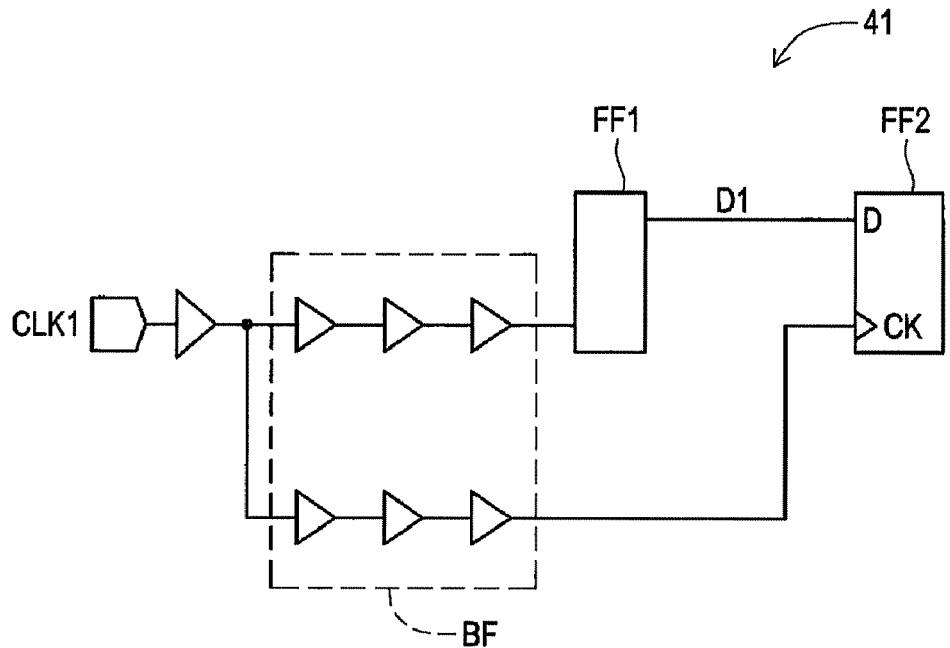

FIG. 9    DIAGRAM SHOWING F-V TABLE TB11

|  | OSCILLATION FREQUENCY f1 | | | |
| --- | --- | --- | --- | --- |
|  | 100 (MHz) | 200 (MHz) | 300 (MHz) | ·· |
| POWER SUPPLY VOLTAGE EV | 0.9 (V) | 1.0 (V) | 1.1 (V) | ·· |
|  | 1.0 (V) | 1.1 (V) | 1.2 (V) | ·· |
|  | — | 1.2 (V) | 1.3 (V) | ·· |
|  | — | — | 1.5 (V) | ·· |

FIG. 11  DIAGRAM SHOWING EXAMPLE OF
DETERMINATION OF SET POWER SUPPLY VOLTAGE SV

| OSCILLATION FREQUENCY f1 | 100 (MHz) | 200 (MHz) | 300 (MHz) | ... |
|---|---|---|---|---|
| SET POWER SUPPLY VOLTAGE SV | 1.0 (V) | 1.2 (V) | 1.5 (V) | ... |

FIG. 12  DIAGRAM SHOWING EXAMPLE OF
ENCODING OF V CODE VC

| OSCILLATION FREQUENCY f1 | 100 (MHz) | 200 (MHz) | 300 (MHz) | ... |
|---|---|---|---|---|
| V CODE VC | 00001 | 00010 | 00100 | ... |

DIAGRAM SHOWING CONVENTIONAL SEMICONDUCTOR DEVICE SYSTEM 100

SEMICONDUCTOR DEVICE, CONTROL METHOD OF SEMICONDUCTOR DEVICE, AND CONTROL INFORMATION GENERATING METHOD FOR SEMICONDUCTOR DEVICE

CROSS-REFERENCE TO RELATED APPLICATIONS

This application is based upon and claims the benefit of priority from the prior Japanese Patent Application No. 2007-253575 filed on Sep. 28, 2007, the entire contents of which are incorporated herein by reference.

BACKGROUND

1. Field

The disclosure relates to semiconductor device, control method of semiconductor device, and control information generating method for semiconductor device.

2. Description of Related Art

FIG. 13 shows a conventional semiconductor device system 100 disclosed in "Supply Voltage Adjustment Technique for Low Power Consumption and its Application to SOCs with Multiple Threshold Voltage CMOS," 2006 Symposium on VLSI Circuits Digest of Technical Papers, by Hiroshi Okano et al. The semiconductor device system 100 is a system relating to a conventional adaptive voltage scaling. The relation between the frequency characteristic of a ring oscillator of a process sensor block 112 and the process variation value on the SPICE model used in simulation is tabulated, and an F-P table 131 is generated. Then, by simulating in plural conditions (by varying process and voltage), the relation between the process variation value and the power supply voltage is tabulated, and a P-V table 141 is generated. The method of simulation is, for example, a method of acquiring the relation between the process variation value and power supply voltage so as to obtain a set-up time in the critical path in the semiconductor device.

The power supply voltage to be supplied from a DC-DC converter 103 to a semiconductor device 102 is determined from the frequency characteristic by using the P-V table 141. As a result, according to the variation state in the manufacturing process of the semiconductor device 102, the value of the power supply voltage to be supplied from the DC converter 103 is determined.

A conventional technique is disclosed in Japanese Patent Application Laid-Open No. 2007-133497.

The conventional technique was, however, when projecting the process variation value to the performance of the transistor, based on two extreme conditions, that is, either all of the plural types of the process variation values are changed to the worst direction, or to the best direction. Indeed, all of the plural types of the process variation values are not fully changed to the worst direction or the best direction, and as far as the two extreme cases are considered, the process variation values is not fully projected onto the performance of the transistor. Hence, sufficient analysis precision is not obtained, and the design margin is set wider than required, and a higher power supply voltage than required is set, and therefore the power consumption of the semiconductor device 102 is not saved.

Also in the conventional technique, instead of evaluation in the two extreme conditions, if multiple conditions are analyzed in consideration of independent fluctuations of the plural types of the process variation values, each of the all possible combinations of the process variation values must be analyzed. Then a problem arises that such analysis requires a tremendous number of simulations, and the time and cost are increased so much.

SUMMARY

One aspect of the embodiment relates to a semiconductor device including plural elements, a storing unit that stores first relation between first information relying on the plural elements and a power supply voltage supplying power to the plural elements, a monitoring unit that includes at least one of the plural elements and monitors second information relying on the at least one of the plural elements, and a control unit that selects a power supply voltage to be associated with the second information based on the first information by confronting the first information and the second information, and controls to set the power supply voltage to be associated with the second information, being selected based on the first information, to the power supply voltage supplying power to the plural elements, wherein the first relation is relation between the first information and the power supply voltage supplying power to the plural elements based on second relation between the first information and plural element variation values relying on the plural elements, and third relation between the power supply voltage supplying power to the plural elements and the plural element variation values relying on the plural elements.

BRIEF DESCRIPTION OF THE DRAWINGS

FIG. 5 is a diagram showing an F-$\xi$ table TB20;

FIG. 7 is a circuit diagram of a critic path;

FIG. 8 is a diagram showing a $\xi$-V table TB30;

FIG. 9 is a diagram showing F-V table TB11;

FIG. 11 is a diagram showing an example of determination of set power supply voltage SV;

FIG. 12 is a diagram showing an example of encoding of V code VC; and

DETAILED DESCRIPTION OF THE EMBODIMENTS

Figure 1:
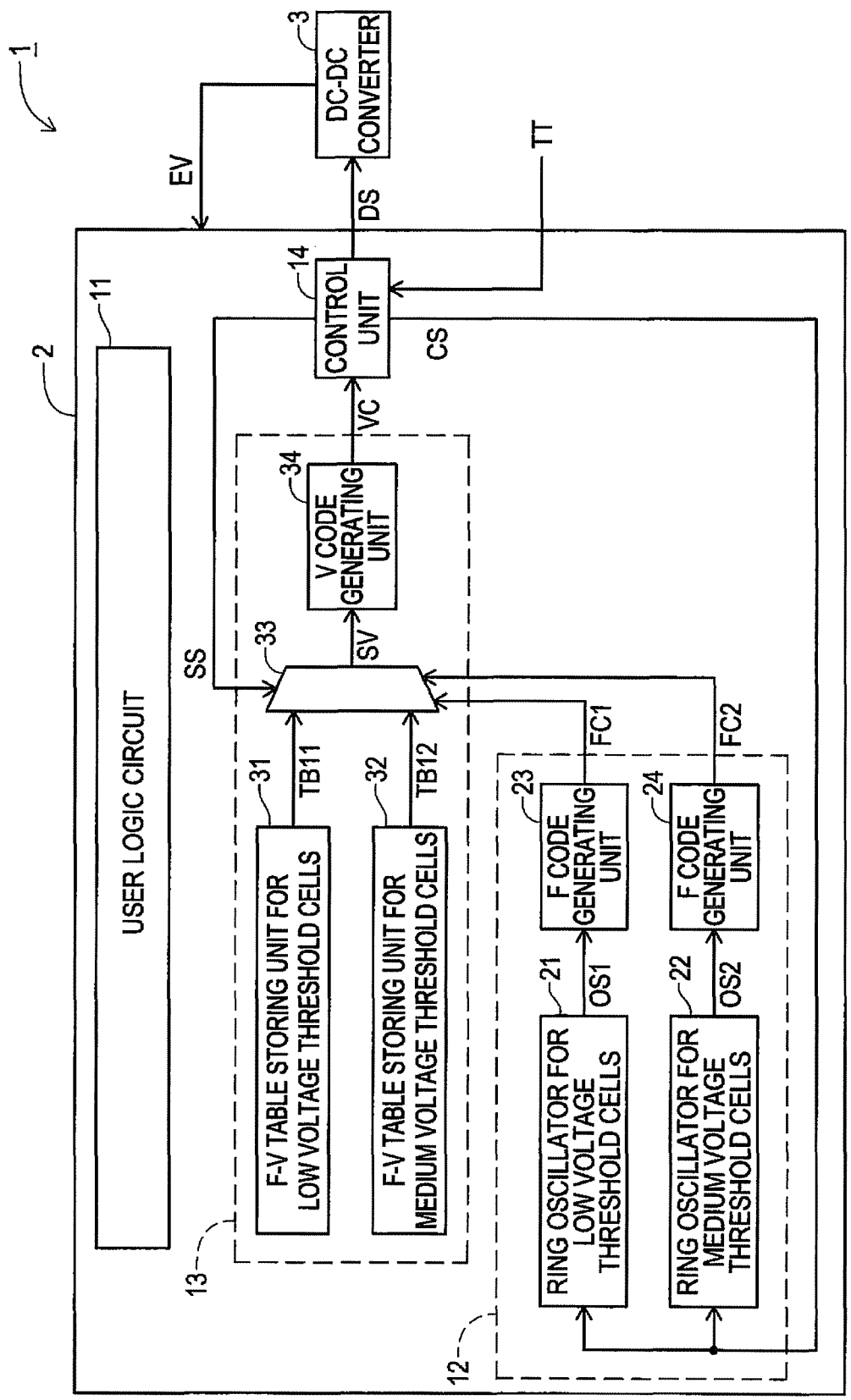
FIG. 1 is a schematic diagram of a semiconductor device system 1.

One aspect of an embodiment includes providing a constant voltage circuit comprising: plural elements; a storing unit that stores first relation between first information relying on the plural elements and a power supply voltage supplying power to the plural elements; a monitoring unit that includes at least one of the plural elements and monitors second information relying on the at least one of the plural elements; and a control unit that selects a power supply voltage to be associated with the second information based on the first information by confronting the first information and the second information, and controls to set the power supply voltage to be associated with the second information, being selected based on the first information, to the power supply voltage supplying power to the plural elements, wherein the first relation is relation between the first information and the power supply voltage supplying power to the plural elements based on: second relation between the first information and plural element variation values relying on the plural elements; and third relation between the power supply voltage supplying power to the plural elements and the plural element variation values relying on the plural elements.

Various circuits are composed of plural elements. A storing unit stores a first relation between first information relying on the plural elements and a power supply voltage supplying power to the plural elements. A monitoring unit includes at least one of the plural elements, and monitors second information relying on at least one of the plural elements. A control unit selects a power supply voltage to be associated with the second information based on the first information by confronting the first information and the second information, and controls to set the power supply voltage to be associated with the second information, being selected based on the first information, to the power supply voltage supplying power to the plural elements.

A second relation is a relation between plural pieces of first information and plural element variation values. Element variation values are variations of process parameters as characteristic variation factors of the semiconductor device. Variations of process parameters are known in plural types, such as transistor gate length, gate width, gate thickness, threshold voltage, gate oxide film thickness, and diffusion resistance variations. The first information is information relying on elements in the circuit of the semiconductor device, and it changes according to the element variation values. The circuit included in the semiconductor device may be an exclusive circuit for monitoring element variations, or a circuit used in actual operation. The second relation is calculated on the basis of independent effects of plural element variation values. From combinations of variation values composed of combinations of plural types of the element variation values, the first information may be obtained on the basis of the second relation. Needless to say, the number of variation value combinations for obtaining a specific first information is not limited to one.

A third relation is a relation between the plural power supply voltages and the plural element variation values. The power supply voltage is a voltage to be supplied to the semiconductor device. The third relation is calculated on the basis of independent effects of the plural element variation values. From combinations of variation values composed of combinations of plural types of the element variation values, the power supply voltage may be obtained on the basis of the third relation. Needless to say, the number of variation value combinations for obtaining a specific power supply voltage is not limited to one.

The first relation is a relation between the first information and the power supply voltage. The first relation is calculated by associating it with the plural element variation values between the second relation and the third relation.

The effects are explained. Hitherto, when projecting the element variation value to the performance of the transistor, the concept was based on the two extreme conditions only, that is, either all of the plural types of the element variation values are changed to the worst direction, or to the best direction. Indeed, however, the element variation values changes independently, and all values are not fully changed to either of the direction. Hence, in the conventional method, variation values of individual elements are not sufficiently formed into a model, and the process variations may not be projected onto the transistor performance, and high analysis precision was not obtained.

On the other hand, in the disclosure, in the second relation and the third relation, the element variation values constituting the combinations of the element variation values are considered separately. The second relation is a relation between the first information and the combination of the element variation values, and the third relation is a relation between the combination of the element variation values and the power supply voltage, and therefore by mutually associating the combinations of the element variation values of the second relation and the third relation, the first relation may be obtained as the relation between the first information and the power supply voltage.

Various methods are known for selecting the combination of the element variation values for associating the second relation and the third relation. For example, as a combination of the element variation values that are common between the second relation and the third relation, a combination of the element variation values may be selected so as to obtain an operation margin of the semiconductor device. In this case, the first relation may be obtained as the relation between the power supply voltage and the first information that enables securing of the operation margin of the semiconductor device. Hence, the power supply voltage is controlled on the basis of the first relation.

In the second relation and the third relation, it is possible to consider independent changes of the plural types of the element variation values. Hence, in any combination of the element variation values, the combination may be projected onto the transistor performance, and a high analysis precision may be obtained.

In the conventional technique, instead of evaluation at the two extreme points, when analyzing in multiple conditions in consideration of independent changes of the plural types of the element variation values, it is required to analyze in each one of combinations of all the element variation values. That is, the conventional technique is an inductive technique, and the number of times of simulation is tremendous, and the time and cost are increased. In the disclosure, however, independent changes of the plural types of element variation values are formed into a model. By using this model, the relation between the power supply voltage and the first information capable of securing the operation margin of the semiconductor device may be reviewed in all combinations of element variation values. That is, since a deductive technique may be used, the time and cost may be saved.

Embodiments of a semiconductor device, a control method of the semiconductor device, and a generation method of control information of the semiconductor device of the disclosure are specifically described below with reference to FIG. 1 to FIG. 12. FIG. 1 shows a semiconductor device system 1 according to an embodiment. The semiconductor device system 1 includes a semiconductor device 2 and a DC-DC converter 3. The semiconductor device 2 is provided with a user logic circuit 11, a process sensor block 12, a static voltage control (SVC) block 13, and a control unit 14.

The process sensor block 12 has a ring oscillator for low voltage threshold cells 21, a ring oscillator for medium voltage threshold cells 22, and F code generating units 23 and 24.

Figure 2:
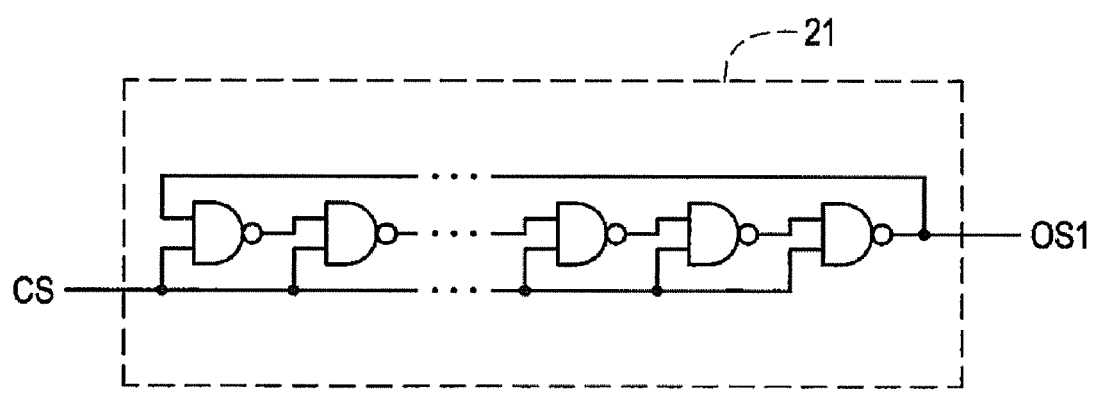
FIG. 2 is a circuit diagram of a ring oscillator 21 for low voltage threshold cells.

As shown in FIG. 2, the ring oscillator for low voltage threshold cells 21 is a loop circuit composed of cascade connection of an odd number of stages of NAND circuits formed of transistors for low voltage threshold cells. The ring oscillator for low voltage threshold cells 21 further receives a test signal CS from the control unit 14, and outputs an oscillation signal OS1 having an oscillation frequency f1. The F code generating unit 23 receives the oscillation signal OS1, and outputs an F code FC1.

The ring oscillator for medium voltage threshold cells 22 receives a test signal CS from the control unit 14, and outputs an oscillation signal OS2 having an oscillation frequency f2.

The F code generating unit 24 receives the oscillation signal OS2, and outputs an F code FC2. The ring oscillator for medium voltage threshold cells 22 is same in configuration as the ring oscillator for low voltage threshold cells 21, except that it is composed of transistors for medium voltage threshold cells, and the specific description is omitted here.

The SVC block 13 has an F-V table storing unit for low voltage threshold cells 31, an F-V table storing unit for medium voltage threshold cells 32, a selector 33, and a V code generating unit 34. The F-V table storing unit for low voltage threshold cells 31 stores an F-V table TB11 created by the table generating method according to the disclosure, and the F-V table TB11 is entered into the selector 33. Similarly, the F-V table storing unit for medium voltage threshold cells 32 stores an F-V table TB12, and the F-V table TB12 is entered into the selector 33. The selector 33 receives F codes FC1 and FC2 from the process sensor block 12, and receives a selection signal SS from the control unit 14.

The V code generating unit 34 receives a set power supply voltage SV from the selector 33. The V code generating unit 34 outputs a V code VC, which is coded from the set power supply voltage SV. At temperature data TT is entered from a temperature sensor, which is not shown. The control unit 14 outputs a control signal CS, a selection signal SS, and a set signal DS.

The set signal DS is entered into the DC-DC converter 3. The DC-DC converter 3 supplies the power supply voltage EV to the semiconductor device 2.

Figure 3:
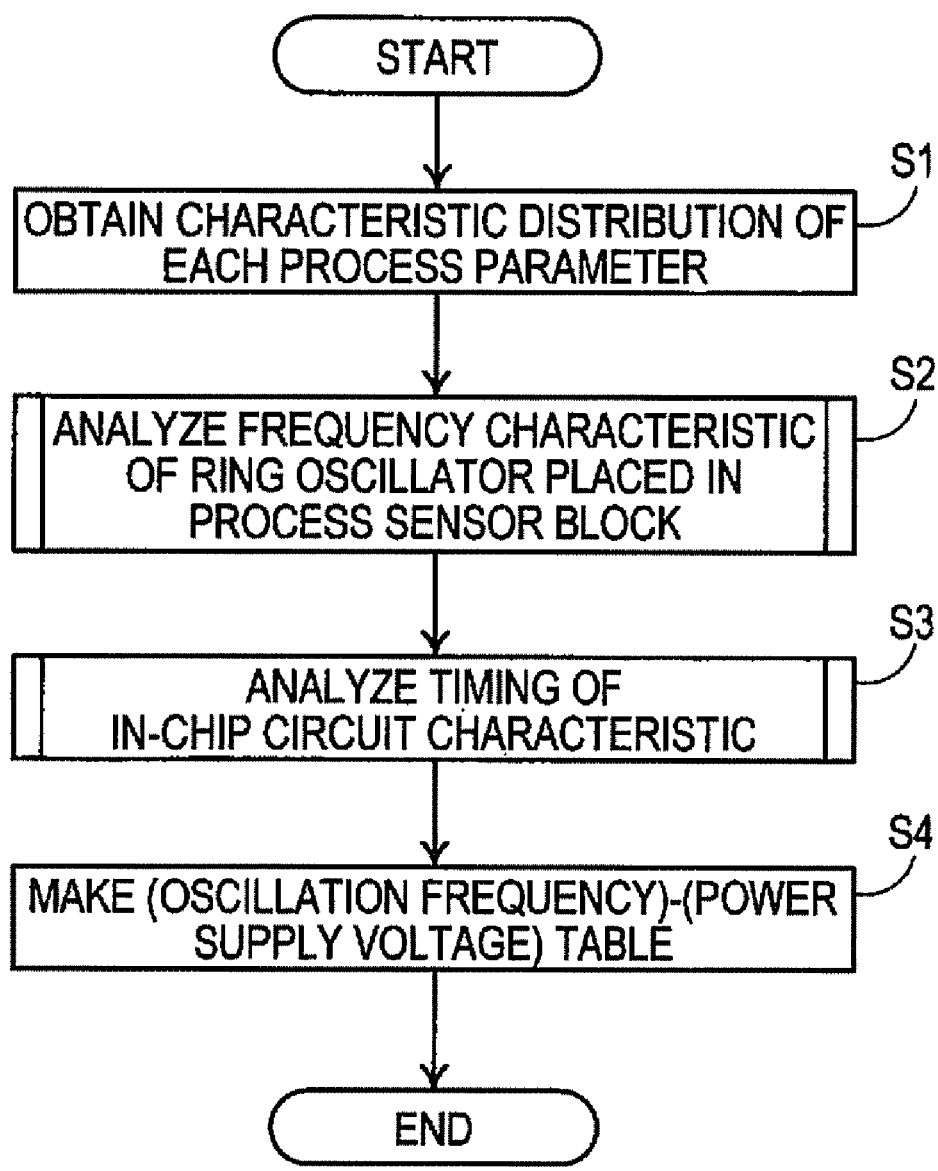
FIG. 3 is a flowchart of F-V table analysis method.

The operation of the semiconductor device system 1 is explained below. First is an analyzing method of the F-V table TB11 stored in the F-V table storing unit for low voltage threshold cells 31 by referring to FIG. 3 to FIG. 9. As shown in FIG. 3, the analyzing method of the F-B table TB11 includes four major steps (hereinafter, abbreviated as S), S1 to S4. At S1, a process characteristic distribution of each process parameter is acquired as the characteristic variation factor of the semiconductor device 2. The process characteristic distribution shows the variation between chips and between lots of the process parameters (transistor's gate length, gate width, gate thickness, threshold voltage, gate oxide film thickness, diffusion resistance, etc.). The process characteristic distribution of each process parameter is modeled in normal distribution of average $\mu$ and standard deviation $\sigma$. The process characteristic distribution of each process parameter is mutually independent.

Figure 4:
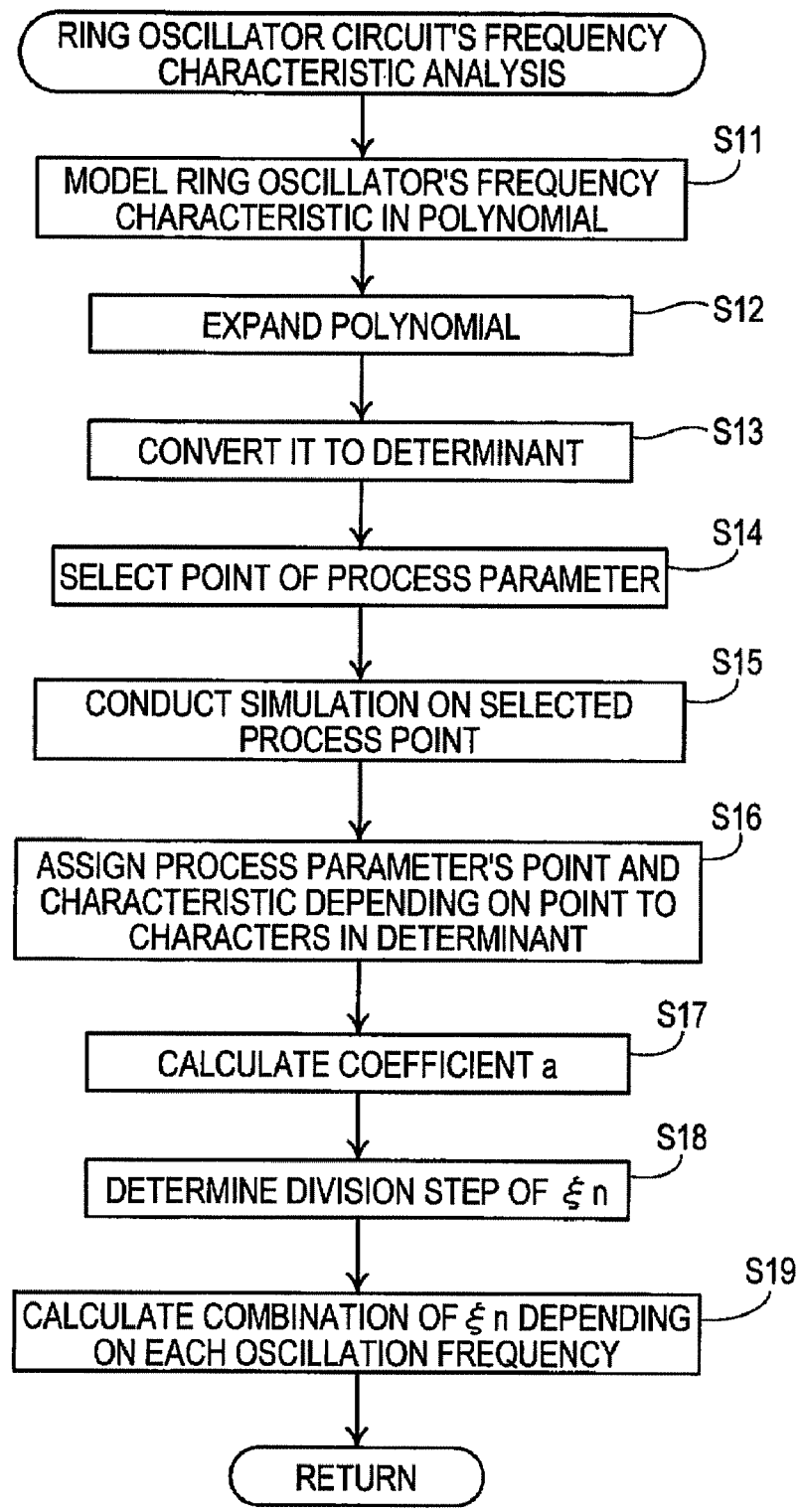
FIG. 4 is a flowchart of ring oscillator circuit's frequency characteristic analysis method.

Details of the frequency characteristic analysis of a ring oscillator circuit mounted on the process sensor block 12 at S2 (FIG. 3) is explained with reference to the flowchart in FIG. 4. This embodiment relates to the analyzing method of the F-V table TB11, and the ring oscillator for low voltage threshold cells 21 is explained below.

At S11, the frequency characteristic of the ring the oscillator for low voltage threshold cells 21 shown in FIG. 2 is modeled in a polynomial expression in Expression (1).

[Expression 1]

$$y = a_0 + \sum_{n=1}^{n} a_n H(\xi_n) \quad \text{Expression (1)}$$

In Expression (1), characteristic y shows the distribution of the oscillation frequency f1 of the ring oscillator for low voltage threshold cells 21. Random number model $\xi n$ is a process variation of each process parameter modeled by normal random number to N (0, 1). In Expression (1), the process characteristic distribution of the normal distribution is expressed by random number model $\xi n$ of the normal random number. The relation between the random number model $\xi n$ of the normal random number and the process characteristic distribution of normal distribution is the relation of achieving the normal distribution N ($\mu$, $\sigma$2) by multiplying the normal random number by standard deviation s, and further adding the average $\mu$.

At S12, by expanding the polynomial expression of Expression (1) by an expression having random number model $\xi n$ of each process parameter, Expression (2) is obtained.

[Expression 2]

$$y = a_0 + a_1\xi_1 + a_2\xi_2 + a_3\xi_3 + \quad \text{Expression (2)}$$

Expression (2) is an expression having ten unknown numbers, coefficients $a_0$ to $a_9$, and three variables, random number models $\xi_1$ to $\xi_3$. That is, Expression (2) expresses the relation between random number models $\xi_1$ to $\xi_3$ weighted by coefficients $a_0$ to $a_9$, and oscillation frequency f1 of the ring oscillator for low voltage threshold cells 21. Herein, the normal random numbers to N (0, 1) are defined by average=0 and dispersion=1, and have a standard normal distribution. When variances of each process parameter are secured in a range of $-3\sigma$ to $+3\sigma$, the random number model $\xi n$ is numerically expressed in a range of $-3$ to $+3$.

At S13, Expression (2) is converted into a determinant, and Expression (3) is obtained.

[Expression 3]

$$\begin{pmatrix} g_1(\xi_{1,0}) & g_2(\xi_{2,0}) & g_3(\xi_{3,0}) \\ g_1(\xi_{1,1}) & g_2(\xi_{2,1}) & g_3(\xi_{3,1}) \\ g_1(\xi_{1,2}) & g_2(\xi_{2,2}) & g_3(\xi_{3,2}) \\ \vdots & \vdots & \vdots \\ g_1(\xi_{1,9}) & g_2(\xi_{2,9}) & g_3(\xi_{3,9}) \end{pmatrix} \begin{pmatrix} a_0 \\ a_1 \\ a_2 \\ \vdots \\ a_9 \end{pmatrix} = \begin{pmatrix} y_0 \\ y_1 \\ y_2 \\ \vdots \\ y_9 \end{pmatrix} \quad \text{Expression (3)}$$

In the determinant in Expression (3), by setting up ten systems of simultaneous equations about characteristics $y_0$ to $y_9$, and solving the simultaneous equations, ten coefficients $a_0$ to $a_9$ are obtained. At S14, to solve the determinant in Expression (3), points of process parameters are selected. Specifically, combinations of three random values of three variables, random number models ($\xi_1$, $\xi_2$, $\xi_3$) are selected arbitrarily by nine sets conforming to the normal random numbers to N (0, 1).

At S15, by simulating the selected process points, the value of characteristic y is obtained. Specifically, using nine sets of combinations of the variation values composed of three random number models ($\xi_1$, $\xi_2$, $\xi_3$), the process is simulated. The simulation includes, for example, an STA (static timing analysis) by SPICE. As a result, characteristics $y_0$ to $y_9$ are obtained. The characteristics $y_0$ to $y_9$ are the oscillation frequency f1 of the ring oscillator for low voltage threshold cells 21 in each combination of the variation values.

At S16, the point of process parameter and the characteristic y corresponding to the point are input into the determinant in Expression (3). Specifically, the values of nine sets of random number models ($\xi_1$, $\xi_2$, $\xi_3$), and the values of characteristics $y_0$ to $y_9$ corresponding to the random number models are input into the determinant in Expression (3), and ten systems of simultaneous equations are obtained. By solving the simultaneous equations, at S17, unknown coefficients $a_0$ to $a_9$ are calculated. Hence, Expression (2) is completed.

At S18, the division step of random number model ξn is determined. The division step is the step value used for transforming into discrete numerical expression from random number model ξn ranging from −3 to +3. When the random number model ξn is transformed into a discrete numerical expression, the analysis time may be shortened as explained below. The smaller the division step value is, the higher is the precision, but the longer becomes the analysis time, and hence the value of division step is selected according to the required analysis precision and the allowable analysis time. In this embodiment, for example, a case of division step=1 is explained. In this case, the random number model ξn takes values −3, −2, −1, 0, 1, 2, and 3.

At S19, by using the Expression (2), by calculating combinations of the random number models ξn according to each oscillation frequency, an F-ξ table showing the relation of the oscillation frequency f1 and the random number model ξn is obtained. FIG. 5 shows an F-ξ table TB20 as an example. In the F-ξ table TB20, there are three combinations of the random number models $\xi_1$ to $\xi_3$ of the oscillation frequency f1 of 100 (MHz), (+1, −2, 3), (−3, +3, −2), and (0, −1, −1). Similarly, there are three combinations of the random number models $\xi_1$ to $\xi_3$ of oscillation frequency f1 of 200 (MHz), (0, −3, 0), (−1, +2, +1), and (+2, 0, −1). Herein, a plurality of combinations of the random number models $\xi_1$ to $\xi_3$ may be determined because, in Expression (2), it is allowed to consider independent variations of the random number models $\xi_1$ to $\xi_3$. Similarly, at other frequencies of the oscillation frequency f1, combinations of the random number models $\xi_1$ to $\xi_3$ may be calculated.

Figure 6:
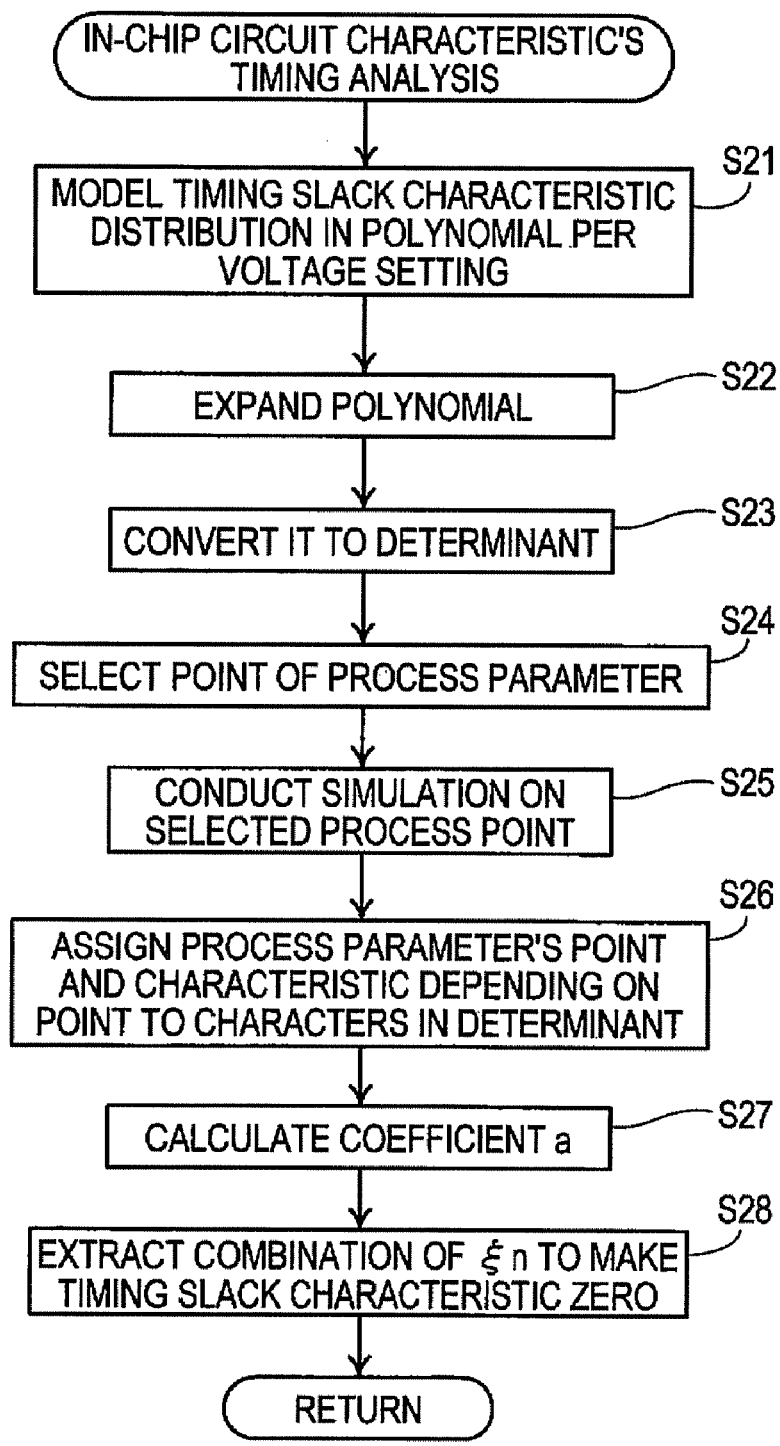
FIG. 6 is a flowchart of in-chip circuit characteristic's timing analysis method.

The detail of timing analysis of circuit characteristic in the chip at S3 (FIG. 3) is explained below with reference to the flowchart in FIG. 6. In the timing analysis of the circuit characteristic in the chip, a critical path is used, which is most difficult in timing in the user logic circuit 11. FIG. 7 shows an example of critical path 41 of the circuit in the chip. A clock signal CLK1 entered into the critical path 41 is branched, and entered into flip-flops FF1 and FF2 by way of a buffer unit BF. The flip-flop FF1 outputs data D1 according to the edge input of the clock signal CLK1, and the data D1 is entered into a data terminal D of the flip-flop FF2. The clock signal CLK1 is entered into a clock terminal CK of the flip-flop FF2.

Herein, the time difference of the data D1 and the clock signal CLK1 entered into the flip-flop FF2 is supposed to be a timing slack TS. In the flip-flop FF2, the limit value of the timing slack TS for allowing to set up is supposed to be 0. Hence, when the timing slack TS is negative, set-up is not allowed, and as the timing slack TS becomes a positive value, the margin of the set-up time becomes wider. The value of the timing slack TS varies according to the state of process variation of the transistors constituting the flip-flops FF1 and FF2, or the value of the power supply voltage EV.

At S21, the timing slack characteristic distribution of the critical path 41 shown in FIG. 7 is modeled by a polynomial expression shown in Expression (4). This polynomial modeling is executed, as mentioned above, by the method disclosed in Japanese Patent Application Laid-Open No. 2007-133497.

[Expression 4]

$$y = a_0 + \sum_{n=1}^{n} a_n H(\xi_n) \qquad \text{Expression (4)}$$

In Expression (4), y denotes the timing slack characteristic distribution of the critical path 41. The random number model ξn shows process variations of each process parameter formed by normal random numbers to N (0, 1).

Expression (4) is set up at every voltage setting corresponding to adjustment steps of output voltage of the DC-DC converter 3. For example, if the DC-DC converter 3 has adjustment steps of the power supply voltage EV from 0.9 V to 1.5 V at 0.1 V increments, Expression (4) is established for seven power supply voltages 0.9, 1.0, 1.1, 1.2, 1.3, 1.4, and 1.5 V.

At S22, the polynomial expression of Expression (4) is expanded by a mathematical expression in which the random number model ξn of each process parameter is a variable, and Expression (5) is obtained.

[Expression 5]

$$y = a_0 + a_1\xi_1 + a_2\xi_2 + a_3\xi_3 + \qquad \text{Expression (5)}$$

Where, composition of Expression (5) is same as the composition of Expression (2) explained above, and the detailed description is omitted here.

At S23, Expression (5) is transformed into a determinant. At S24, points of process parameters ($\xi_1, \xi_2, \xi_3$) are selected. At S26, the point of the process parameter and the characteristic y according to the point are input into the determinant. At S27, unknown coefficients $a_0$ to $a_9$ are calculated. The flow of S23 to S27 in Expression (5) is same as the flow of S13 to S17 (FIG. 4) about Expression (2) mentioned above, and detailed description is omitted here.

At S28, by using Expression (5), at every power supply voltage EV, a combination of the random number model ξn in which the timing slack TS is 0 is calculated. As a result, an ξ-V table showing the relation of the random number model ξn and the power supply voltage EV is obtained. FIG. 8 shows an example of an ξ-V table TB30. In the ξ-V table TB30, when the power supply voltage is 0.9 V, there are three combinations of the random number models $\xi_1$ to $\xi_3$ of the timing slack TS of 0, (+2, −2, −2), (−2, +1, −2), and (0, −1, −1). Similarly, when the power supply voltage EV is 1.0 V, there are three combinations of random number models $\xi_1$ to $\xi_3$ of the timing slack TS of 0, (−3, +3, 2), (0, +2, +3), and (+2, 0, −1) Similarly, at other values of the power supply voltage EV, combinations of the random number models $\xi_1$ to $\xi_3$ may be calculated.

Back to S4 (FIG. 3), the F-V table TB11 (FIG. 9) is generated to show the relation of the oscillation frequency f1 and the power supply voltage EV. The F-V table TB11 is obtained by establishing the relation between the F-ξ table TB20 and the ξ-V table TB30. That is, the F-ξ table TB20 shows the relation of oscillation frequency f1 and the combination of the random number model ξn, and the ξ-V table TB30 shows the relation between the combination of the random number model ξn and the power supply voltage EV, and hence by mutually relating the combination of random number model ξn between the F-ξ table TB20 and the ξ-V table TB30, the F-V table TB11 can be obtained.

Herein, various methods are known about the selection of combination of the random number model ξn for correlating the F-ξ table TB20 and the ξ-V table TB30. For example, there is a method of selecting combination of random number model ξn common between the F-ξ table TB20 and the ξ-V table TB30. In this case, the timing slack TS is 0 or more, and the F-V table TB11 capable of securing the operation margin of the semiconductor device 2 may be obtained.

The operation is more specifically described below. The combination of random number model ξn at the oscillation frequency f1=100 MHz of the F-ξ table TB20, and the combination of the random number model ξn at the power supply voltage EV=0.9 V of the ξ-V table TB30 both coincide at (0, −1, −1). The combination of random number model ξn at the oscillation frequency f1=100 MHz of the F-ξ table TB20, and the combination of the random number model ξn at the power supply voltage EV=1.0 V of the ξ-V table TB30 both coincide at (+2, 0, −1). Hence, in the F-B table TB11, the oscillation frequency f1=100 MHz and the power supply voltage EV=0.9, 1.0 V are correlated. That is, at the oscillation frequency f1=100 MHz, if the power supply voltage EV is 0.9 or 1.0 V, it is known that the operation margin of the semiconductor device 2 may be secured.

By using the similar relating method, as shown in the F-V table TB11, the oscillation frequency f1=200 MHz and the power supply voltage EV=1.0, 1.1, 1.2 V are correlated, and the oscillation frequency f1=300 MHz and the power supply voltage EV=1.1, 1.2, 1.3, 1.5 V are related. The generated F-V table TB11 is stored in the F-V table storing unit for the low voltage threshold cells 31.

This is the explanation about analyzing method of the F-V table TB11 stored in the F-V table storing unit for low voltage threshold cells 31, with reference to S1 to S4. The analyzing method of the F-V table TB12 stored in the F-V table TB12 for medium voltage threshold cells is same as the analyzing method of the F-B table TB11 described above, and the detailed description is omitted here.

Figure 10:
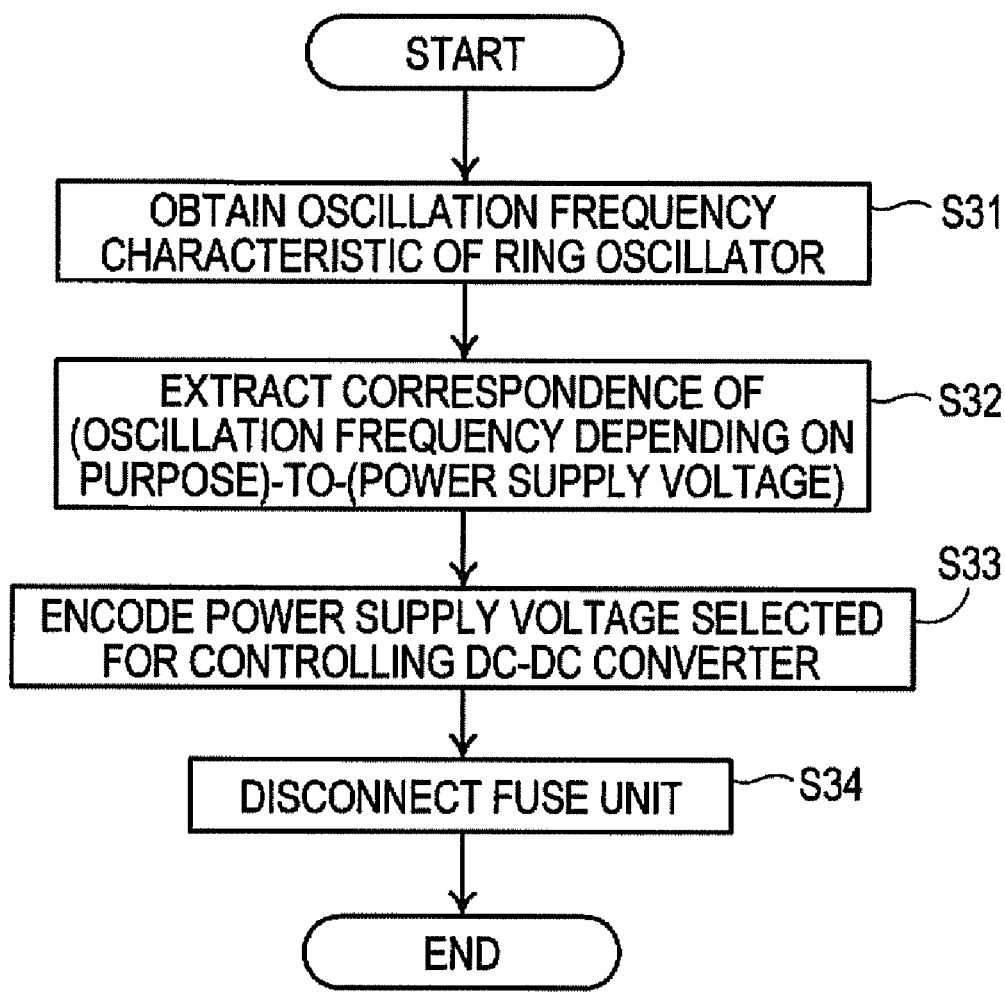
FIG. 10 is a flowchart of fuse disconnection method by using the F-V table.
Figure 13:
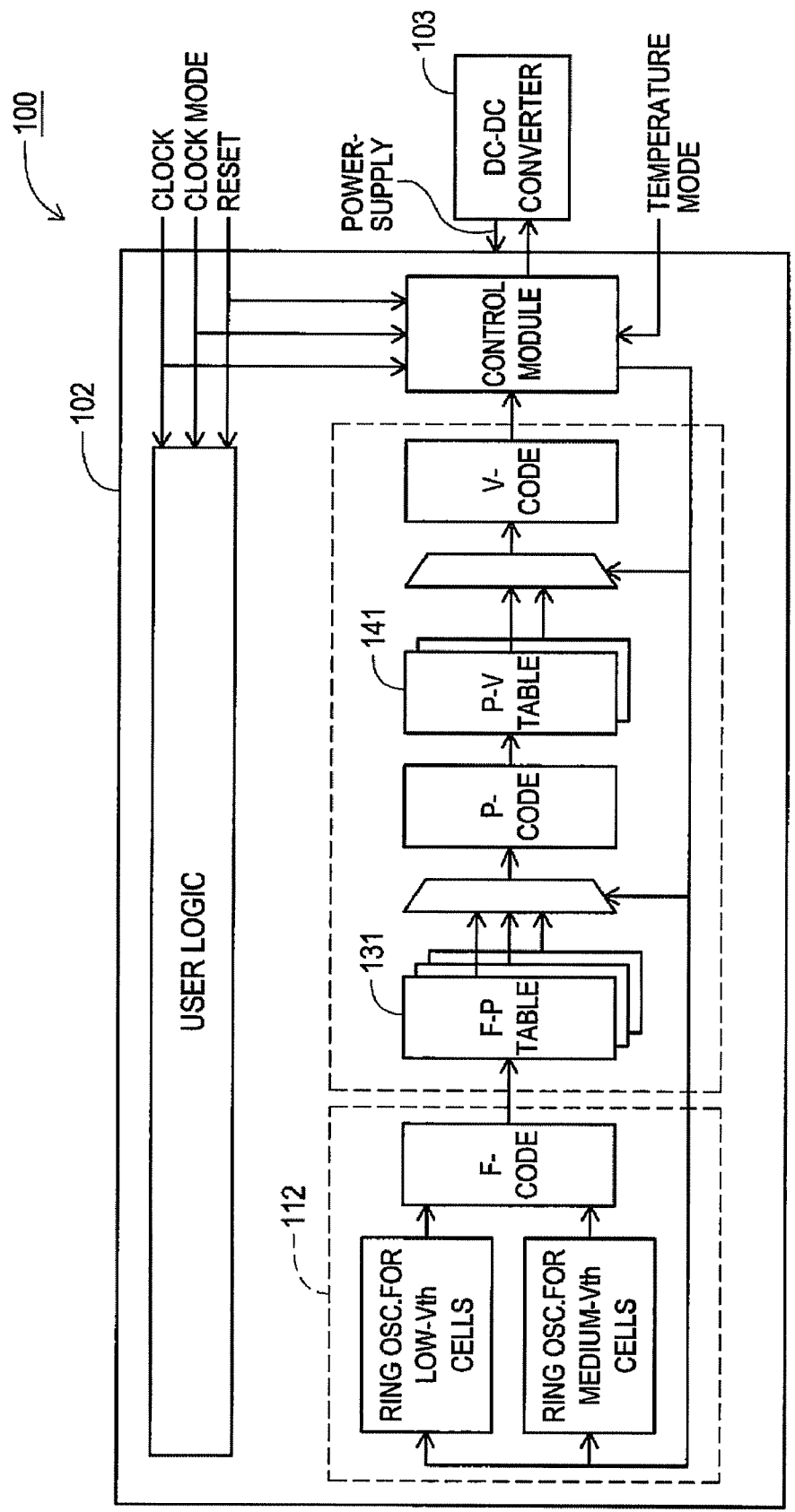
FIG. 13 is a diagram showing conventional semiconductor device system 100.

Referring now to the flowchart in FIG. 10, the method of determining the power supply voltage EV by using the F-V tables TB11 and TB12 is explained. The power supply voltage EV is determined as initial setting of the semiconductor device system 1, at the time of, for example, shipping test of the semiconductor device system 1.

At S31, the oscillation frequency characteristic of the ring oscillator is acquired. Specifically, when shipping test of the semiconductor device system 1 is started, a test signal CS is output from the control unit 14. According to the test signal CS, the ring oscillator for low voltage threshold cells 21 begins to oscillate, and the oscillation signal OS1 at the oscillation frequency f1 is output. The oscillation frequency f1 corresponds to the time of one turn of logical value about the ring oscillator for low voltage threshold cells 21. By measuring the oscillation frequency f1, therefore, the average delay time of the NAND circuit may be obtained, and the manufacturing process of the low voltage threshold cells may be assessed. An F code generating unit 23 outputs an F code FC1 corresponding to the oscillation frequency f1 of the oscillation signal OS1, and it is input into the selector 33.

Similarly, as for the ring oscillator for medium voltage threshold cells 22, an oscillation frequency f2 of an oscillation signal OS2 is obtained. The F code generating unit 24 outputs an F code FC2 corresponding to the oscillation frequency f2 of the oscillation frequency OS2, and it is input into the selector 33.

At S32, the selector 33 extracts the relation of the oscillation frequencies f1 and f2 and the power supply voltage EV. Extraction of the correlation at the selector 33 is executed by selecting the power supply voltage EV from the F-V tables TB11 (FIG. 9) and the TB12 according to the F codes FC1, FC2 and a selection signal SS. Herein, the selection signal SS is a signal output from the control unit 14 according to the selection purpose of the power supply voltage EV. If the selection purpose is saving of power consumption, the selection signal SS is output so as to select the lowest voltage of the power supply voltages EV capable of securing the operation margin of the semiconductor device 2. If the selection purpose is securing of operation margin, the selection signal SS is output so as to select the highest voltage of the power supply voltages EV capable of securing the operation margin of the semiconductor device 2. Or, according to the selection purpose, it is determined whether to determine the power supply voltage EV by using either the F-V table TB11 or the F-V table TB12, or to determine the power supply voltage EV by using both the F-V table TB11 and the F-V table TB12.

For example, for the purpose of saving of power consumption, a method of determining the power supply voltage EV by using the F-V table TB11 (FIG. 9) is explained. When the FC1 showing that oscillation frequency f1 is 100 MHz is entered into the selector 33, the selector 33 selects the minimum voltage of 0.9 V as the set power supply voltage SV. Similarly, when the oscillation frequency f1 is 200 MHz, the selector 33 selects the minimum voltage of 1.0 V, or when oscillation frequency f1 is 300 MHz, the minimum voltage of 1.1 V is selected. Hence, for the purpose of saving of power consumption, when using the F-V table TB11, as shown in FIG. 11, a correspondence table of the oscillation frequency f1 and the set power supply voltage SV is obtained. The set power supply voltage SV selected by the selector 33 is input into the V code generating unit 34.

At S33, the V code generating unit 34 converts the selected set power supply voltage SV to a five-bit V code VC for the purpose of control by the DC-DC converter 3. FIG. 12 shows a coded example of set power supply voltage SV in FIG. 11. The generated V code VC is output from the V code generating unit 34, and input into the control unit 14.

At S34, the control unit 14 outputs a set signal DS corresponding to the V code VC, and it is input into the DC converter 3. In the DC converter 3, a fuse unit, which is not shown, is cut off according to the set signal DS. As a result, the value of the power supply voltage EV output from the DC-DC converter 3 is set at the set power supply voltage SV, and this setting is maintained in the DC-DC converter 3.

As described herein, according to the semiconductor device of this embodiment, the control method of the semiconductor device, and the generating method of control information of the semiconductor device, variables such as individual random number models $\xi_1$ to $\xi_3$ are modeled in Expression (2) and Expression (5). Hence, in any combination of the variables such as random number models $\xi_1$ to $\xi_3$, the combination may be projected onto the transistor performance. Hence, in Expression (2) and Expression (5), a plurality of combinations of the random number models $\xi_1$ to $\xi_3$ satisfying the characteristic (y) may be calculated, and a plurality of power supply voltages EV corresponding to one oscillation frequency may be obtained in the F-V table TB11. As a result, a high precision of analysis may be obtained, and the design margin is not set wider than needed, or a higher power supply voltage than needed is not supplied to the semiconductor device, and thereby the semiconductor device may be saved in power.

Hitherto, when analyzing in multiple conditions in consideration of individual changes of the random number models $\xi_1$ to $\xi_3$, analysis is needed in each one of plural combinations of the random number models $\xi_1$ to $\xi_3$. That is, the technique is inductive, and the number of times of simulation is tremendous, and the time and cost are increased. In the disclosure, however, by using Expression (2) and Expression (5) individually weighting random number models $\xi_1$ to $\xi_3$, it is applicable if the random number models $\xi_1$ to $\xi_3$ are individually changed. Hence, by using Expression (2) and Expression (5), it is possible to review the relation between the power supply voltage EV and the oscillation frequency f1 capable of securing the operation margin of the semiconductor device 2 about all combinations of the random number models ξn. That is, a deductive technique may be employed, and the time and cost for analyzing the F-V table TB11 may be saved.

The disclosure is not limited to the foregoing embodiment alone, but may be changed or modified variously within a scope not departing from the true spirit of the disclosure. In this embodiment, in the selector 33, the power supply voltage EV is determined by using the F-V table TB11, but not limited to this form, the F-V table TB11 or TB12 may be selectively used according to the selection purpose of the power supply voltage EV. For example, if the medium voltage threshold cells are dominant in the operation margin of the semiconductor device 2, it may be preferred to determine the power supply voltage EV by using the F-V table TB12. Or, the average value of the power supply voltage obtained by using the F-B table TB11 and the power supply voltage determined by using the F-B table TB12 is obtained, and the average is defined as the power supply voltage EV. When, for example, two power supply voltages are supplied to the semiconductor device 2, that is, the power supply voltage EV1 for low voltage threshold cells and the power supply voltage EV2 for medium voltage threshold cells, the power supply voltage EV1 for low voltage threshold cells is determined by using the F-V table TB11, and the power supply voltage EV2 for medium voltage threshold cells is determined by using the F-V table TB12.

In this embodiment, the combination of the random number models $\xi n$ consists of three models $\xi_1$ to $\xi_3$, but not limited to this form, the number of combinations may be increased. When the number of combinations is increased, the number of process parameters to be considered is increased, and analysis of higher precision is achieved. When the number of combinations is increased, the precision of analysis is higher, but the required analysis time is longer, and hence the number of combinations may be determined according to the required analysis precision and allowable analysis time.

In this embodiment, as the initial setting of the semiconductor device system 1, the power supply voltage EV is determined at the time of shipping test, but it is not limited to this form. For example, in a dynamic process depending on characteristic changes by temperature changes or the like, during operation of the semiconductor device system 1, the process sensor block 12 is operated periodically, and the value of the power supply voltage EV may be updated. In a dynamic control, for example, depending on a temperature data TT entered from an external temperature sensor not shown, the selection signal SS output from the selector 33 may be corrected. Since the characteristic of the semiconductor device is particularly sensitive to temperature changes, the power supply voltage EV may be controlled with higher precision, and the semiconductor device 2 is further saved in power consumption.

In this embodiment, a fuse unit is provided in the DC-DC converter 3, but it is not limited to this example, it may be provided in the semiconductor device 2. In this case, by shipping test of the semiconductor device 2 alone, the power supply voltage EV is determined, and then the value of the power supply voltage EV may be maintained in the semiconductor device 2.

The disclosure provides a method of generating control information of semiconductor device depending on variation characteristic distribution of process parameters, at high precision while suppressing the increase of time and cost, a semiconductor device having such control information, and a control method of such semiconductor device.

Although a few embodiments have been shown and described, it would be appreciated by those skilled in the art that changes might be made in these embodiments without departing from the principles and spirit of the invention, the scope of which is defined in the claims and their equivalents.

What is claimed is:

1. A semiconductor device comprising:
   plural elements;
   a storing unit that stores first relation between first information relying on the plural elements and a power supply voltage supplying power to the plural elements;
   a monitoring unit that includes at least one of the plural elements and monitors second information relying on the at least one of the plural elements; and
   a control unit that selects a power supply voltage to be associated with the second information based on the first relation by confronting the first information and the second information, and controls to set the power supply voltage to be associated with the second information, being selected based on the first relation, to the power supply voltage supplying power to the plural elements,
   wherein the first relation is relation between the first information and the power supply voltage supplying power to the plural elements based on:
   second relation between the first information and plural element variation values relying on the plural elements;
   third relation between the power supply voltage supplying power to the plural elements and the plural element variation values relying on the plural elements; and
   the power supply voltage supplying power to the plural elements in the third relation is based on influence of the plural element variation values to which a weighting value is applied so that a slack value based on timing analysis of a path that includes the at least one of the plural elements coincide with a predetermined value.

2. The semiconductor device according to claim 1, wherein the monitoring unit is a ring oscillator constituted with the at least one of the plural elements,
   the first information is first oscillation frequency based on simulation of the ring oscillator, and
   the second information is second oscillation frequency of the ring oscillator.

3. The semiconductor device according to claim 1, wherein the weighting value is calculated in accordance with normal distribution.

4. The semiconductor device according to claim 1, wherein association of the first information and the power supply voltage in the first relation corresponds to association of the first information and the power supply voltage acquired when (a) and (b) coincide with each other:
   (a) each of the plural element variation values directed to the first information that is acquired in the second relation; and
   (b) each of the plural element variation values of which the slack value directed to the power supply voltage that is acquired in the third relation coincides with a predetermined value.

5. The semiconductor device according to claim 1, wherein the power supply voltage controlled and set by the control unit is a minimum power supply voltage when there are plural power supply voltages to be associated with variations of the plural elements monitored by the monitoring unit in the first relation.

6. A control method of a semiconductor device that comprises plural elements, a storing unit that stores first relation between first information relying on the plural elements and a power supply voltage supplying power to the plural elements, and a monitoring unit that includes at least one of the plural elements and monitors second information relying on the at least one of the plural elements, the control method comprising:

selecting a power supply voltage to be associated with the second information based on the first relation by confronting the first information and the second information; and controlling to set the power supply voltage to be associated with the second information, being selected based on the first relation, to the power supply voltage supplying power to the plural elements, wherein the first relation is relation between the first information and the power supply voltage supplying power to the plural elements based on:

second relation between the first information and plural element variation values relying on the plural elements;

third relation between the power supply voltage supplying power to the plural elements and the plural element variation values relying on the plural elements; and wherein the control method further comprising calculating the power supply voltage supplying power to the plural elements in the third relation based on influence of the plural element variation values to which a weighting value is applied so that a slack value based on timing analysis of a path that includes the at least one of the plural elements coincide with a predetermined value.

7. The control method of the semiconductor device according to claim 6, wherein the monitoring unit is a ring oscillator constituted with the at least one of the plural elements, wherein the control method further comprising:

calculating first oscillation frequency as the first information based on simulation of the ring oscillator; and monitoring second oscillation frequency of the ring oscillator as the second information.

8. The control method of the semiconductor device according to claim 6 wherein the weighting value is calculated in accordance with normal distribution.

9. The control method of the semiconductor device according to claim 6 wherein association of the first information and the power supply voltage in the first relation corresponds to association of the first information and the power supply voltage acquired when (a) and (b) coincide with each other:

(a) each of the plural element variation values directed to the first information that is acquired in the second relation; and (b) each of the plural element variation values of which the slack value directed to the power supply voltage that is acquired in the third relation coincides with a predetermined value.

10. The control method of the semiconductor device according to claim 6, wherein the power supply voltage controlled and set with the control method is a minimum power supply voltage when there are plural power supply voltages to be associated with variations of the plural elements monitored by the monitoring unit in the first relation.

11. A control information generating method for a semiconductor device that comprises plural elements, a storing unit that stores first relation between first information relying on the plural elements and a power supply voltage supplying power to the plural elements, and a monitoring unit that includes at least one of the plural elements and monitors second information relying on the at least one of the plural elements, the control information generating method comprising:

calculating second relation between the first information and plural element variation values relying on the plural elements;

calculating third relation between the power supply voltage supplying power to the plural elements and the plural element variation values relying on the plural elements;

calculating the first relation between the first information and the power supply voltage supplying power to the plural elements based on the second relation and the third relation; and wherein the control information generating method further comprising calculating the power supply voltage supplying power to the plural elements in the third relation based on influence of the plural element variation values to which a weighting value is applied so that a slack value based on timing analysis of a path that includes the at least one of the plural elements coincide with a predetermined value.

12. The control information generating method for the semiconductor device according to claim 11, wherein the weighting value is calculated in accordance with normal distribution.

13. The control information generating method for the semiconductor device according to claim 11, wherein association of the first information and the power supply voltage in the first relation corresponds to association of the first information and the power supply voltage acquired when (a) and (b) coincide with each other:

(a) each of the plural element variation values directed to the first information that is acquired in the second relation; and (b) each of the plural element variation values of which the slack value directed to the power supply voltage that is acquired in the third relation coincides with a predetermined value.

* * * * *